(12) United States Patent
Subramanian

(10) Patent No.: US 7,015,068 B2
(45) Date of Patent: Mar. 21, 2006

(54) PARTIAL WAFER PROCESSING FOR RANDOM SIZE WAFERS

(75) Inventor: Balamurugan Subramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 212 days.

(21) Appl. No.: 10/158,885

(22) Filed: Jun. 3, 2002

(65) Prior Publication Data

US 2003/0224552 A1 Dec. 4, 2003

(51) Int. Cl.
H01L 21/44 (2006.01)

(52) U.S. Cl. .................. 438/113; 438/460; 438/462; 438/464

(58) Field of Classification Search ............ 438/113, 438/460, 462, 464, 973, 975; 702/95; 221/203; 382/151

See application file for complete search history.

(56) References Cited

U.S. PATENT DOCUMENTS

| | | |
|---|---|---|
| 6,156,625 A | 12/2000 | Balamurugan |
| 6,174,788 B1 | 1/2001 | Balamurugan |
| 6,216,055 B1 | 4/2001 | Balamurugan et al. |

Primary Examiner—David S. Blum

(74) Attorney, Agent, or Firm—W. James Brady, III; Frederick J. Telecky, Jr.

(57) ABSTRACT

A method of processing a partial wafer in accordance with one embodiment comprises includes after of loading partial wafer into wafer table of pick and place equipment after saw; downloading wafer map data for the wafer from wafer map data host. If the partial wafer has a reference die then positioning the wafer table to the reference die and then moving the wafer table to the last column of the partial wafer. If the partial wafer does not have a reference die the last column (LCOLUMN) information is obtained from wafer map data header field in one embodiment and using LCOLUMN information remove all dies in the right side of partial wafer map. The wafer table is moved to pseudo reference die which is the first die in the bottom right. The pseudo reference die coordinate (x1, y1) is calculated where x1=first column from right to left that has a die in the wafer map data and y1=first bottom most row in the column x1 from the wafer map data. If this partial wafer is not the last partial wafer of this wafer, the wafer table is moved to the last left column (LCOLUMN) of the partial wafer. The LCOLUMN is set as complete if this is the last partial wafer and then the LCOLUMN is updated in the wafer map data header field in the original wafer map. The LCOLUMN information is used remove all dies from the wafer map data that are not part of this partial wafer. The LCOLUMN is updated in the wafer map data header field. The wafer map data file is saved for next partial wafer of the same wafer to process in the pick and place equipment and the then pick and place operation.

14 Claims, 14 Drawing Sheets

WAFER CUT PERPENDICULAR TO WAFER FLAT

FIRST CUT WITH REFERENCE DIE
PROCESSING ORDER MUST FOLLOW THE ABOVE SEQUENCE

FIG. 26

| OLD METHOD | METHOD 1 | METHOD 2 | METHOD 3 | METHOD 4 |
|---|---|---|---|---|
| LOCATOR DIE COORDINATE (x,y) | USES LCOLUMN AND PSEUDO REFERENCE DIE | A NEW BIN NUMBER IS ASSIGNED TO PICKED DIE. THIS BIN NUMBER IS CALLED PICKED DIE BIN AND ALL THE PICKED DIE COORDINATES ARE STORED. USES PSEUDO REFERENCE DIE | USES LCOLUMN AND PSEUDO REFERENCE DIE | CAN USE ANY ONE OF METHOD 1 OR METHOD 2 OR METHOD 3 |
| USES WAFERMAP SYSTEM HOST TO STORE AND MANIPULATE THE DATA | STORES THE LCOLUMN INFORMATION IN THE WAFERMAP DATA FILE ITSELF | USE LCOLUMN INFORMATION TO FIND THE EDGE AND STORE THE PICKED DIE COORDINATES IN THE WAFERMAP DATA FILE ITSELF | STORES THE LCOLUMN AND WAFER ID INFORMATION IN A SEPARATE FILE NOT IN THE WAFERMAP DATA FILE ITSELF | DIFFERENCE BETWEEN THIS METHOD AND OTHER THREE METHOD IS PREPROCESSING IS DONE ON THE PARTIAL WAFER SO THAT ONLY PARTIAL WAFER MAP DATA WILL BE SENT TO MOUNTER. ALL THE PREVIOUS THREE METHODS CAN USE PREPROCESSING. |
| | SAME WAFERMAP DATA FILE IS USED FOR ALL PARTIAL WAFERS WITH DIFFERENT LCOLUMN VALUES | SAME WAFERMAP DATA FILE IS USED FOR ALL PARTIAL WAFERS. AFTER A PARTIAL WAFER PROCESS COMPLETED MOVE ALL THE PICKED DIES COORDINATES TO PICKED DIE BIN. | BEFORE PROCESSING A PARTIAL WAFER, GET LCOLUMN INFORMATION FROM THE STORAGE. SAME WAFERMAP DATA FILE IS USED FOR ALL PARTIAL WAFERS. | |

PARTIAL WAFER PROCESSING FOR RANDOM SIZE WAFERS

FIELD OF INVENTION

This invention relates to partial wafer processing and more particularly to processing multiple random size wafers in pick and place equipment for operations using a wafer map.

BACKGROUND OF INVENTION

A typical semiconductor wafer with a containing die and having a flat edge is illustrated in FIG. 1. A process using a wafer map eliminates the inking of reject die at a wafer fab by using the map data available from the probe test to position the wafer to exact location of all the good die on the Die Bonder or Tape and Reel. Hence, direct jumps to good die are possible without scanning the whole wafer. The wafer map coordinates are illustrated in FIG. 2.

In wafer mapping, the wafer map data contains good, bad, plug and edge dies coordinates with reference to a reference die of a wafer. A bin number in wafer map data is a category of dies. For example, bin 1 is all good first grade dies, bin 2 is all good second grade dies, bin 3 is all plug dies, bin 4 is all bad edge dies and bin 5 is edge bad dies.

For wafer map operation, each piece of wafer requires a reference die to process that wafer. A full wafer has one reference die. Wafers are also processed in halves, quarters, and other sizes to match production lot size at an Assembly/Test (A/T) site. In case of partial wafers, reference die in each piece of wafer is not available.

Without a method to process partial wafers using wafer map, small die wafer map operation is incomplete and cannot be fully implemented in assembly operations. Alternatives like scrapping partial wafers or processing all dies on partial wafers are not cost effective solutions.

Partial wafer processing is described in Balamurugan et al. patent application Ser. No. 09/188,989 filed Nov. 9, 1998 entitled "Partial Semiconductor Wafer Processing; Balamurugan patent application Ser. No. 09/262,265; filed Mar. 4, 1999 and entitled "Partial Semiconductor Wafer Processing with Multiple Cuts of Random Sizes"; and Balamurugan application Ser. No. 09/262,554 filed Mar. 4, 1999, entitled "Partial Semiconductor Wafer Processing Using Wafermap Display." These applications are incorporated herein by reference. While the method of partial wafer processing Ser. No. 09/262,265 permits processing with random cuts others than quartered and half, the method is not easily suitable for processing outside the local fab and the last column of the first row must contain a die. This system requires a locator die coordinate and uses the wafer map host to store and manipulate the data.

It is desirable to provide new methods that provide a way to process partial wafers in different sizes other than quarter or half to match production requirements or production lot size and at different locations. It is desirable that these partial wafers be easily processed at different fabs from that where the wafer map was generated. These fabs may be within the same company or outside the company. A better method is desirable for processing partial wafers even if the last column of the first row does not contain a die and without both x and y coordinate information and without a reference die.

SUMMARY OF INVENTION

In accordance with one embodiment of the present invention a method of processing partial wafers for pick and place equipment includes the steps of making all partial wafer cuts perpendicular to the wafer flat with all partial wafer cuts following a cut sequence where the first cut section is with a reference die and the other cut sections are in the numerical order from right to left with the first partial wafer of the full wafer having a reference die. A pseudo reference die is identified for each partial wafer not having a reference die which die is the first die in the bottom right. The wafer table is moved to the last left column of the partial wafer from the reference or pseudo reference die and the coordinate is determined. All dies using this coordinate that are not part of the partial wafer are removed from the wafer map. The picking and placing of the dies is then performed.

In accordance with an embodiment of the present invention a method of processing partial dies is provided by all partial wafer cuts being made perpendicular to the wafer flat; all partial wafer cuts follow a cut sequence where the first cut section 1 is with the reference die and the other cut sections are in the numerical order from right to left with the first partial wafer of the full wafer having the reference die and the last column (LCOLUMN) is a number, left most column coordinate of a die of a partial wafer and a pseudo reference die acts as a reference die if there is no reference die in the partial wafer. The last column is identified by a number representing the left most column coordinate of a die where the coordinate is calculated using the reference die or pseudo reference die location.

In accordance with one embodiment of the present invention this last column number is identified in the header of the wafer map data file for the next partial wafer and a pseudo reference die is found by adding one column number to the last column die number in the header.

In accordance with one embodiment of the present invention a wafer map data file is provided containing a header identifying a full or partial wafer and if a partial wafer a reference such that a wafer pick and place equipment can identify the starting point location of the partial wafer for wafer mapping operations to process the partial wafer for picking good dies.

In accordance with an embodiment of the present invention a partial wafer is defined by header information indicating a search starting column and the processing equipment searches and finds the boundary of the partial wafer.

DESCRIPTION OF DRAWINGS

FIG. 26 illustrates the four methods disclosed herein and a prior art (old) method.

DESCRIPTION OF PREFERRED EMBODIMENT OF THE PRESENT INVENTION

A method is provided herein to process partial wafers. This method provides a way to create a process to do partial wafer and enables processing of partial wafers using wafer mapping. The first partial wafer of the full wafer must have the reference die. The last column of a partial wafer (LCOLUMN) is identified by a number representing the left most column coordinate of a die where the coordinate is calculated from the reference die or pseudo reference die location. A wafer map data file is created for each wafer during the process that identifies in the header the lot number, the wafer number and according to one embodiment (Method 1) of the present invention the header contains a last column (LCOLUMN) number representing the last column (X coordinate) in the first row of the previous partial die.

There are different wafer map formats and some have the following formats.

Format 1:

```
START
    Wafer map Header
    Bin 1
        Details
        X&Y coordinates
    Bin 2
        Details
        X&Y coordinates
    Bin 3
        Details
        X&Y coordinates
    Bin n
        Details
        X&Y coordinates
END
```

Format 2:

```
START
    Wafer map Header
    Bin map
                    99199
                  9111999
                 991221999
                 991212129
                   1211119
                    92229
    1-bin1
    2-bin2
    9-bin9
END
```

Figure 1:
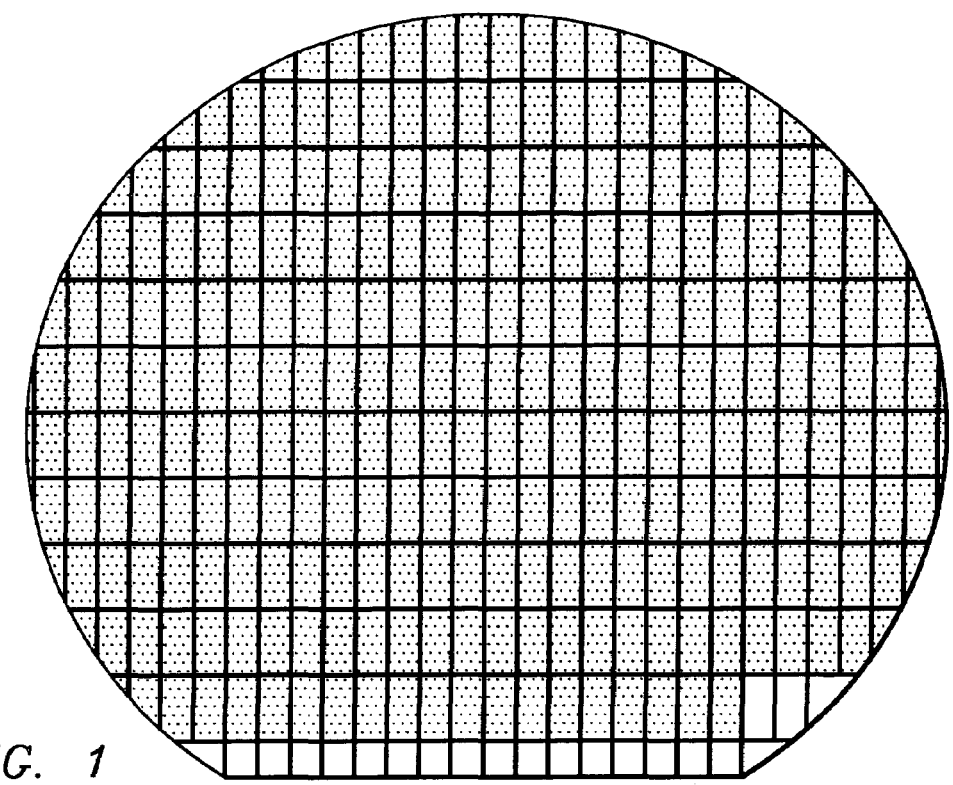
FIG. 1 illustrates a typical wafer containing dies.
Figure 2:
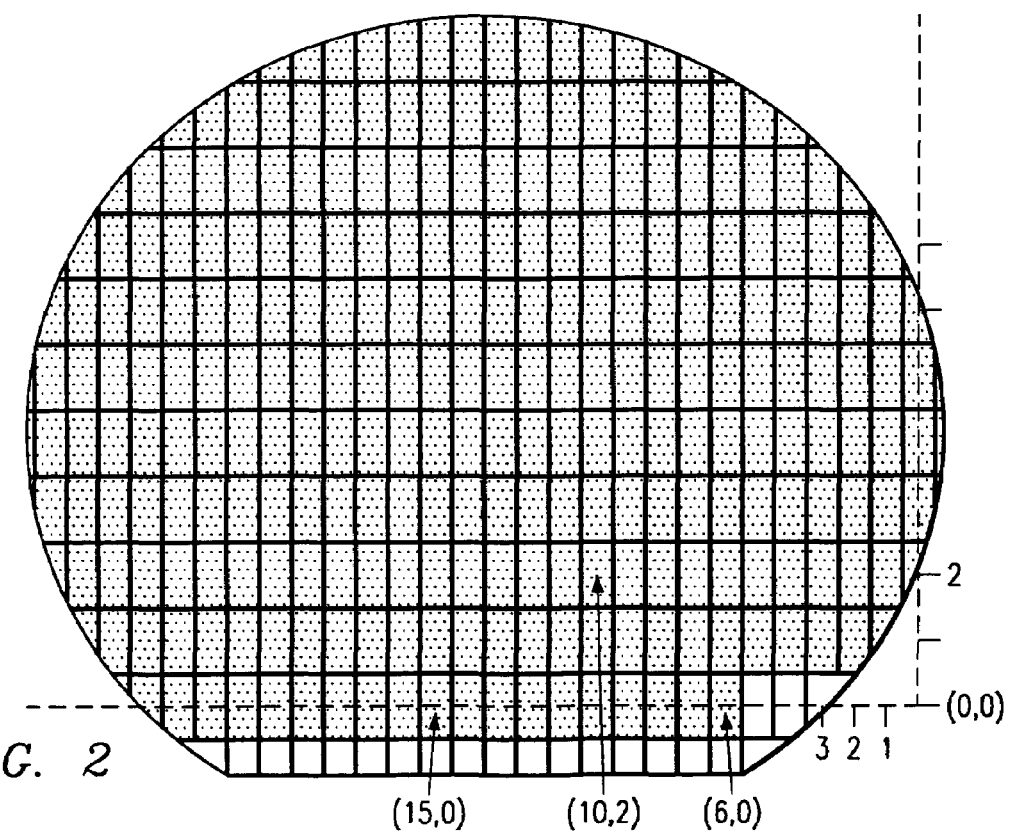
FIG. 2 illustrates wafer map coordinates.
Figure 3:
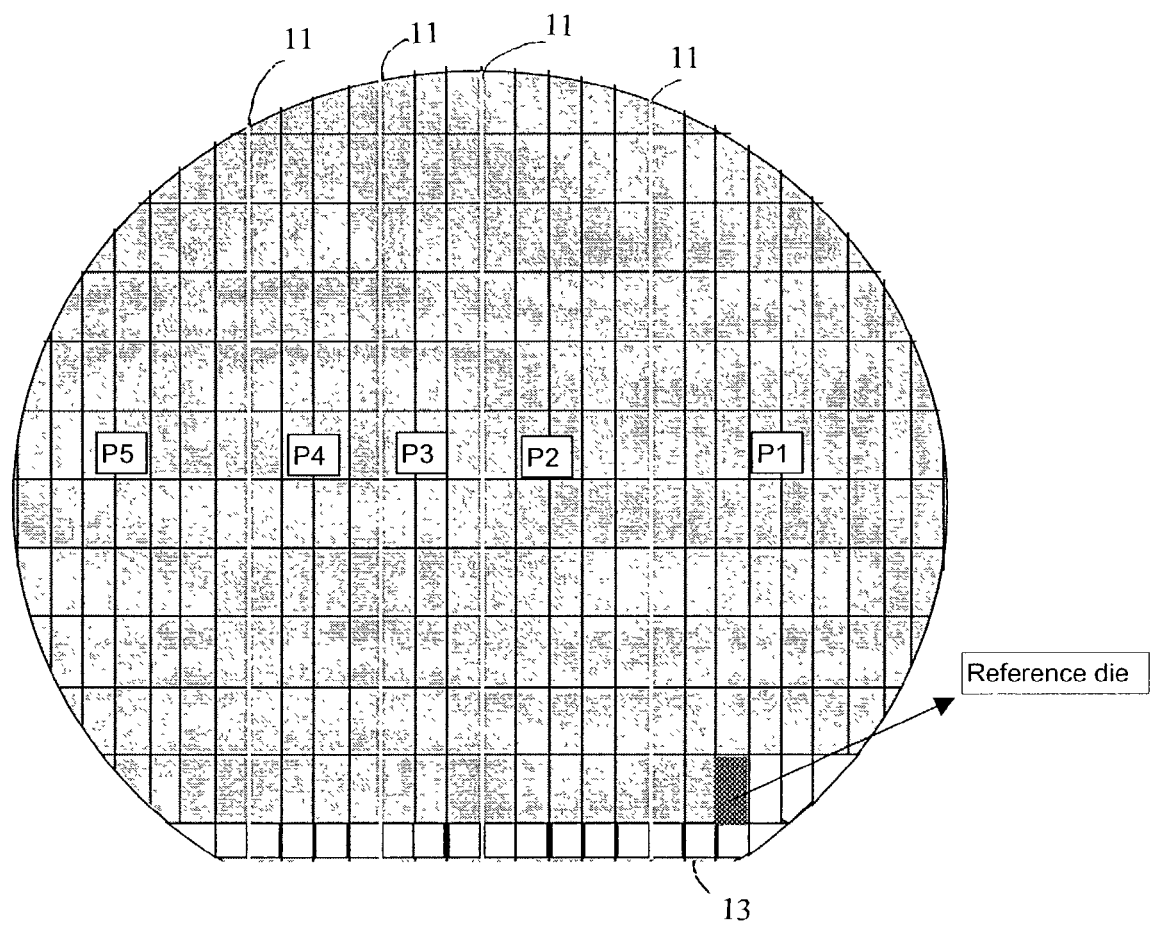
FIG. 3 illustrates the wafer cuts perpendicular to the wafer flat.
Figure 4:
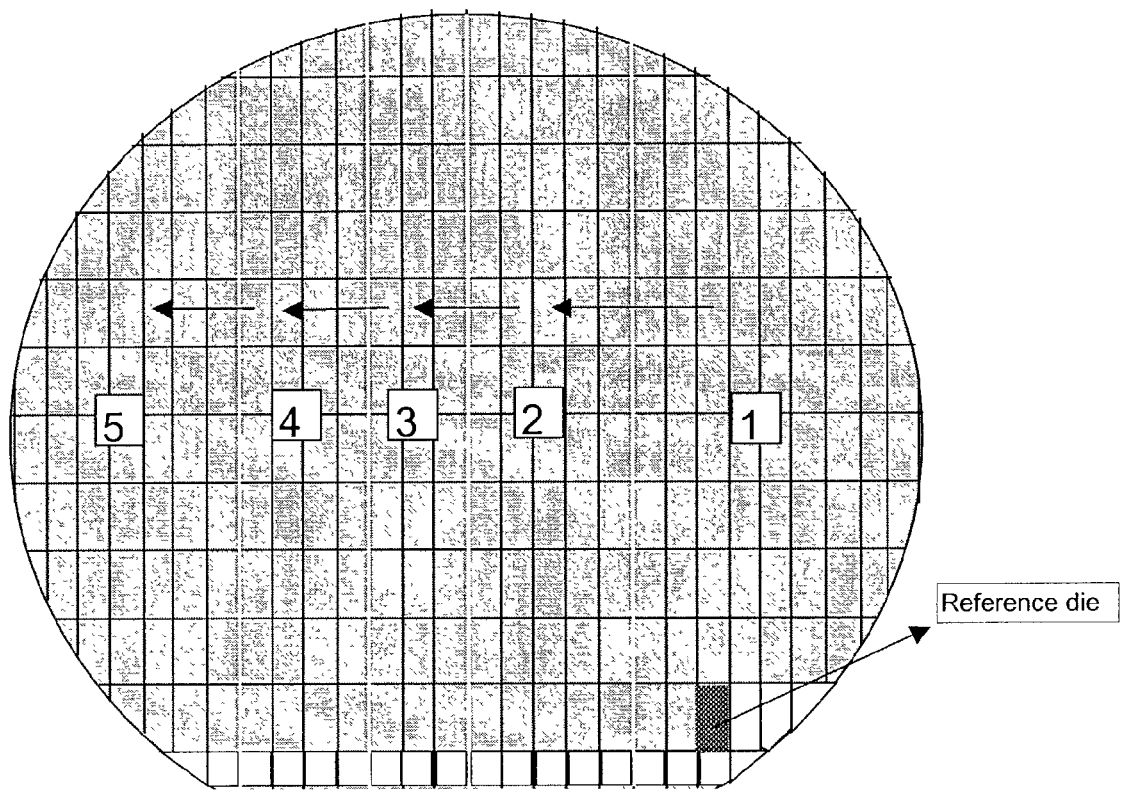
FIG. 4 illustrates the first cut with the reference die and the processing order.
Figure 5:
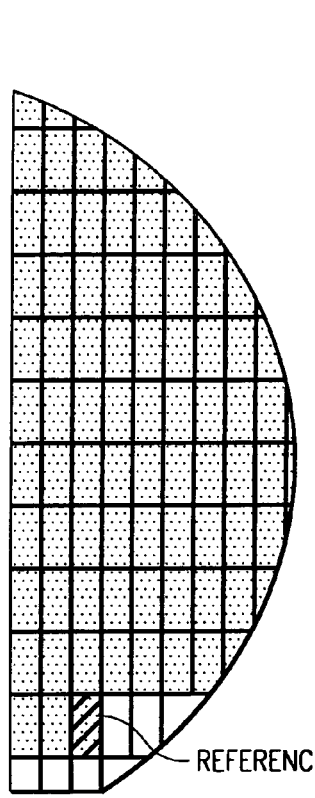
FIG. 5 illustrates the first partial wafer with a reference die.
Figure 6:
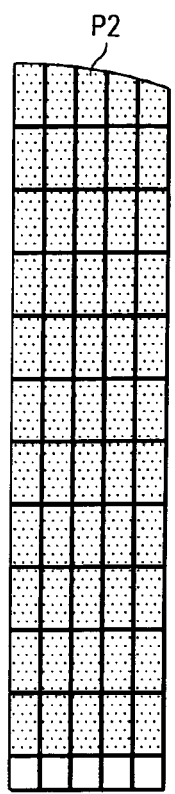
FIG. 6 illustrates a partial wafer without a reference die.
Figure 8:
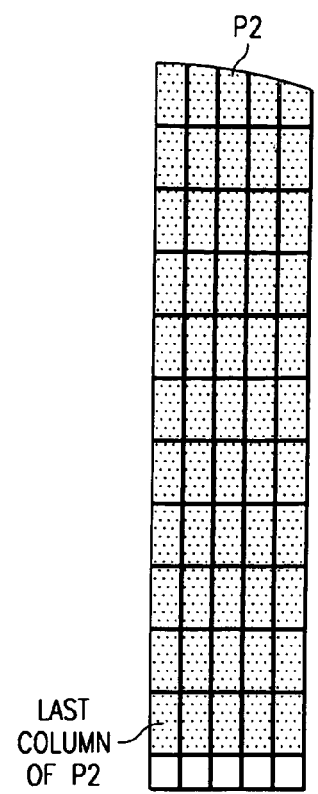
FIG. 8 illustrates the last column of a partial wafer without a reference die.
Figure 7:
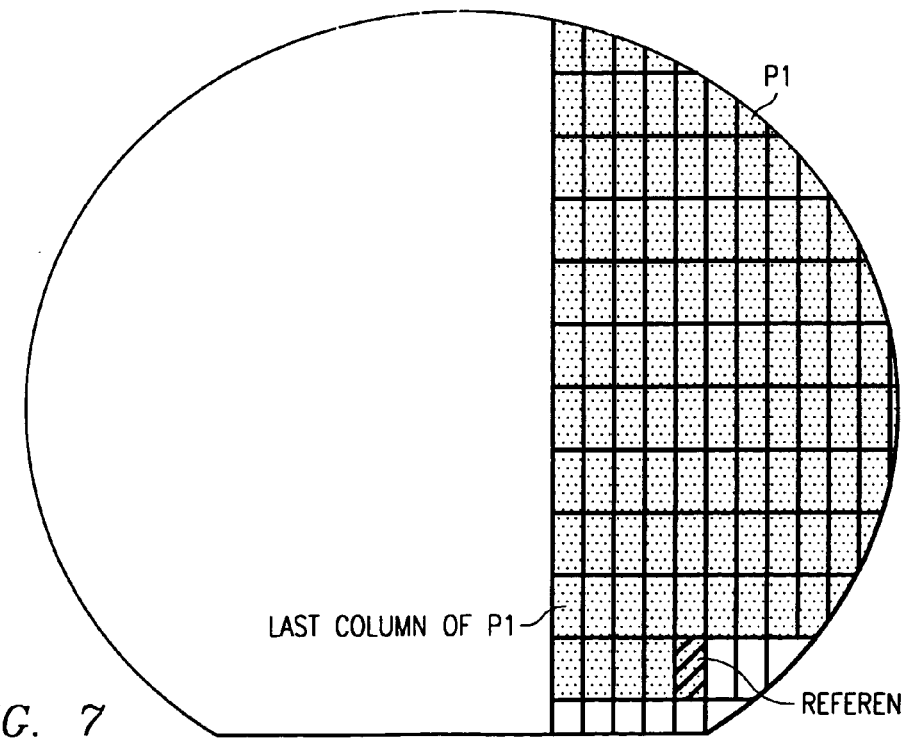
FIG. 7 illustrates the last column of a partial wafer with a reference die.
Figure 9:
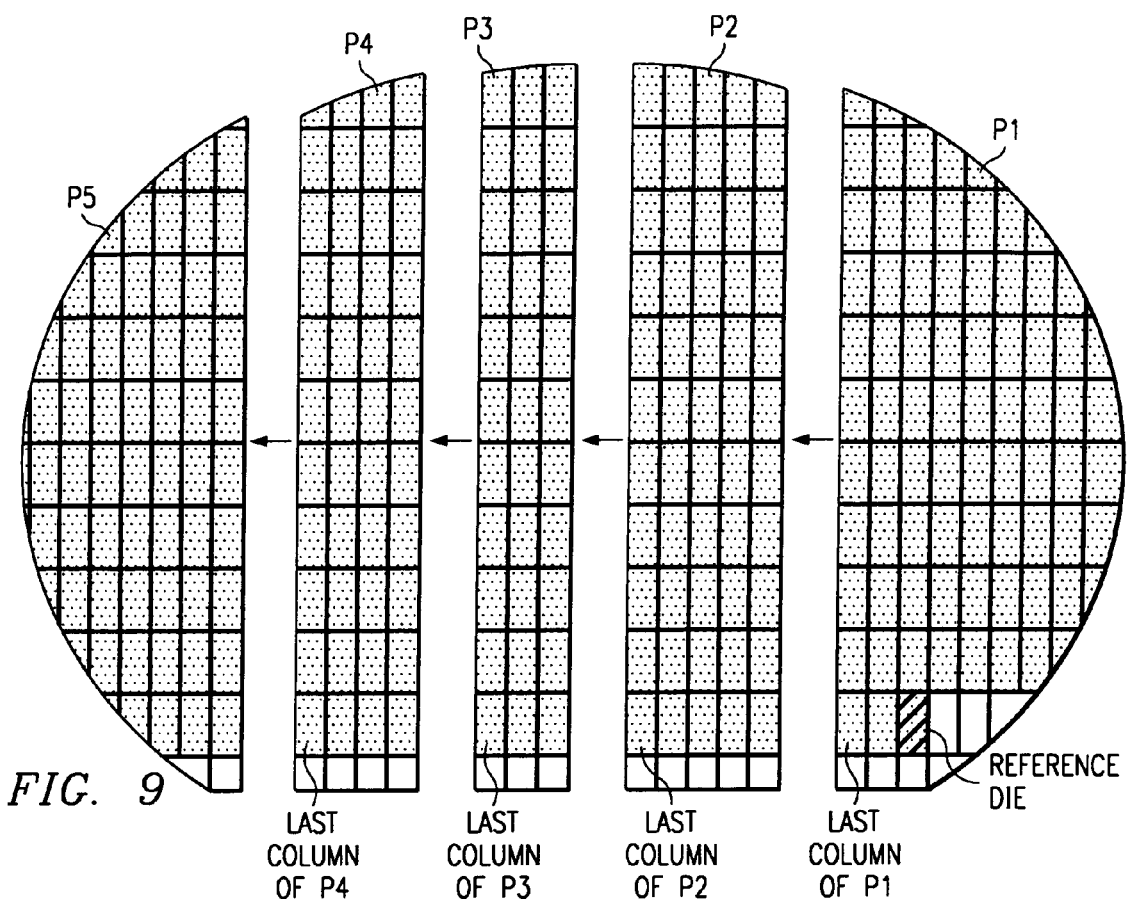
FIG. 9 illustrates the last column (LCOLUMN) of all of the partial wafers of a wafer.
Figure 10:
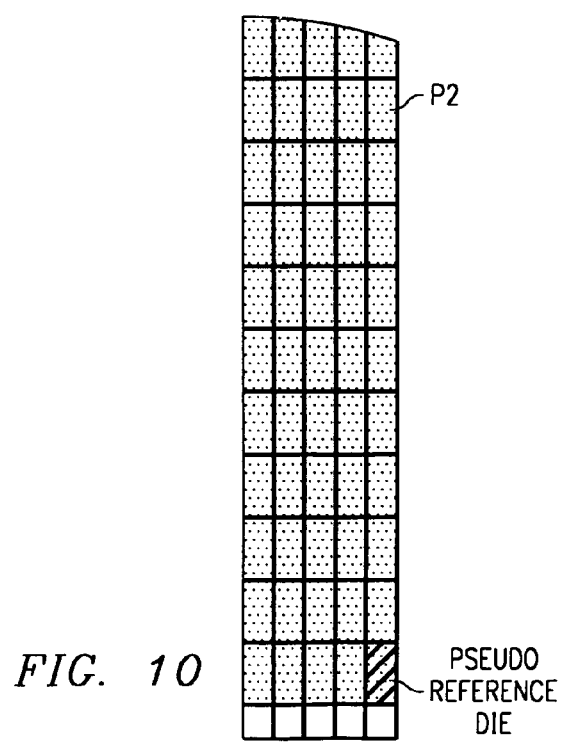
FIG. 10 illustrates a pseudo reference die of a partial wafer P2.
Figure 11:
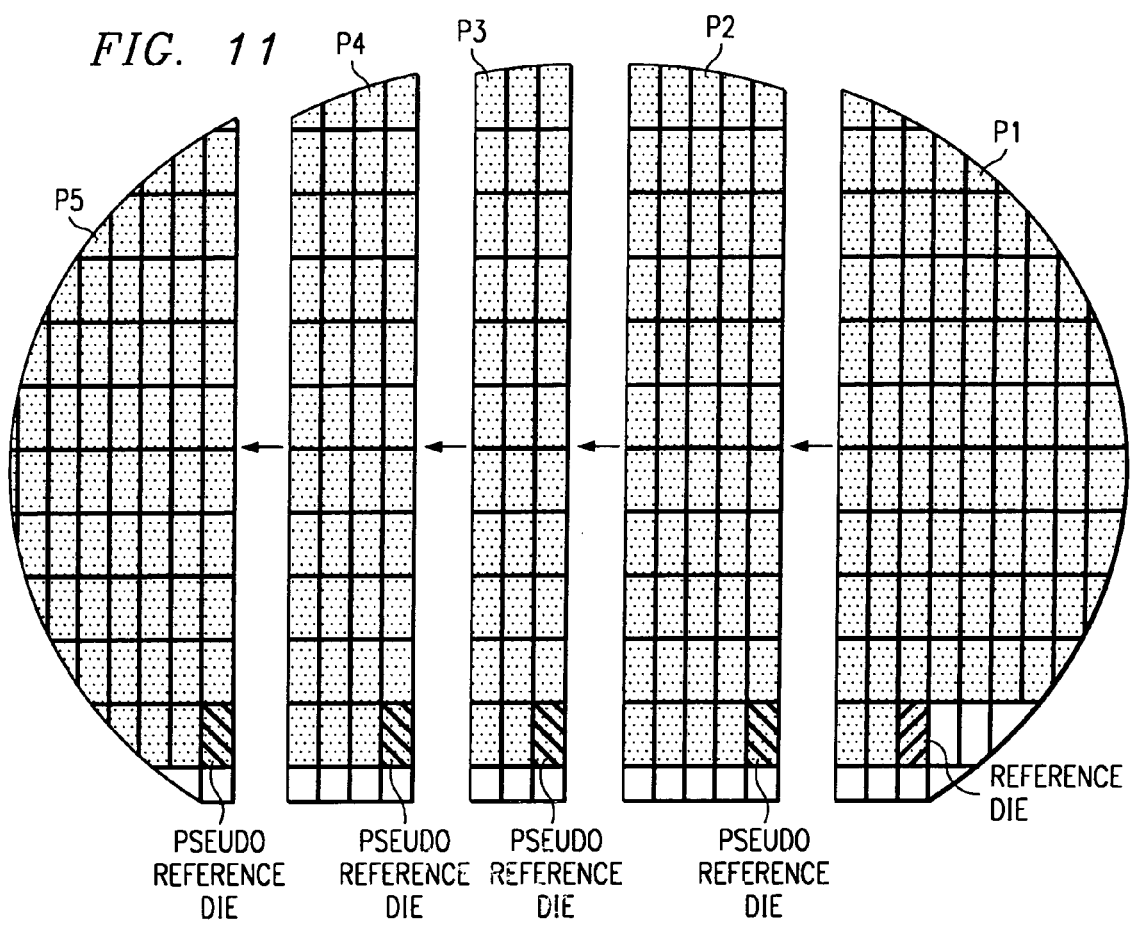
FIG. 11 illustrates a reference die and all pseudo reference dies and the reference die of a wafer.
Figure 12:
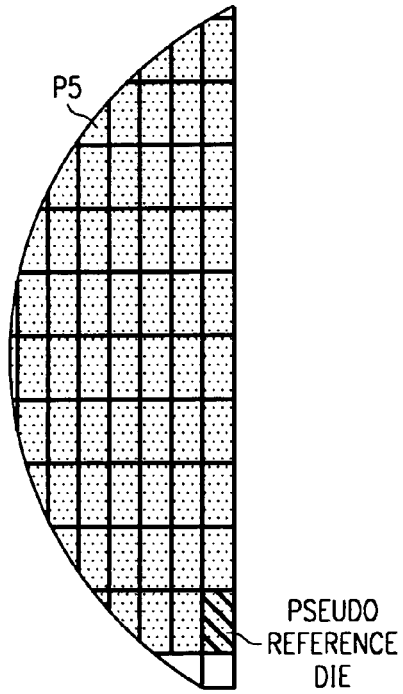
FIG. 12 illustrates the last partial wafer and pseudo reference die.

In the processing of partial wafers according to the present invention there are certain assumptions. They are as follows:

1. All partial wafer cuts 11 are done perpendicular to the flat 13 as illustrated in FIG. 3.
2. All partial wafer cuts must follow a cut sequence as shown in FIG. 4 where the first cut section 1 is with the reference die and the other cut sections 2 through 5 are in the numerical order 2–5 from right to left.
3. The first partial wafer of the full wafer must have the reference die. The FIG. 5 shows the first partial wafer that contains the reference die. FIG. 6 illustrates a partial wafer without a reference die. The last column of a partial wafer called LCOLUMN. FIG. 7 illustrates the last column of the first wafer with a reference die. The last column is identified by a number representing the left most column coordinate of a die where the coordinate is calculated from the reference die or pseudo reference die location. FIGS. 7, 8 and 9 shows the LCOLUMN of a partial wafer. This LCOLUMN number for the subsequent partial wafer is identified by the last column (LCOLUMN) number of the previous partial wafer. The last column of a partial wafer that does not contain a reference die is illustrated in FIG. 8. FIG. 9 illustrates a last column of all of the partial wafers except the last partial wafer P5. A pseudo reference die is a die that acts like a reference die if there is no reference die available in the partial wafer. The FIGS. 10, 11 and 12 show the pseudo reference die of a partial wafer. The pseudo reference die coordinate (x1,y1) is x1=first column from right to left that has a die in the wafer map data and y1=first bottom most row in the column x1 from the wafer map data or x1=first column from right to left that has a die in unpicked die bin of wafer map data and y1=first bottom row in the column x1 in unpicked die bin of wafer map data. That column number for Method 1 is located on the next partial wafer map header and therefore wherever the wafer map and partial wafer is sent the wafer map tells by the header where the reference die or pseudo reference is located for the partial wafer or whole wafer.

Figure 13:
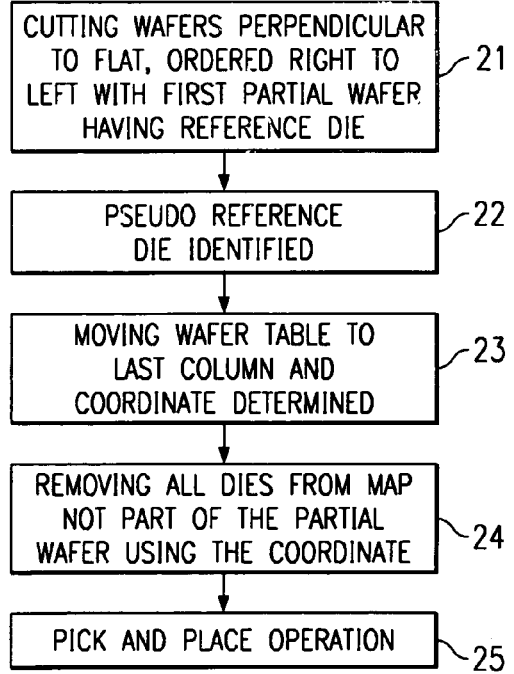
FIG. 13 illustrates an overall method of processing wafers according to one embodiment of the present invention.

Referring to FIG. 13 there is illustrated an overall method of processing a partial wafer. In step 21 the wafers are processed by either by cutting the wafer into pieces in the processing order from left to right P1-P5 perpendicular to the wafer flat as illustrated in FIG. 4 or it may be done by just cutting what is needed in one cut, storing the rest of the wafer for later use or splitting up the partial wafers and sending to different assembly/test locations. The first wafer (right most wafer) contains the reference die. In the next step 22 a pseudo reference die is identified for each partial wafer not having a reference die which die is the first die in the bottom right. In step 23 the wafer table is moved to the last left column of the partial wafer from the reference or pseudo reference die and the coordinate is determined. In step 24 all dies using this coordinate that are greater than last column are not part of the partial wafer are removed from the wafer map. The last step 25 is the picking and placing of the dies.

The processing of the whole wafer or partial wafer may be according to one of the four methods described below.

Method 1

The following steps are based on the zero degree of wafer rotation angle. The same steps are applicable for different rotation angles. An assumption is made as wafer map data header field "Previous Partial Wafer End Column" is exists in wafer map data header. The flow chart in FIG. 14 describes the flow.

Step 101. Load partial wafer into wafer table of pick and place equipment after saw.

Step 102. Download wafer map data for the wafer from wafer map data host.

Step 103. If the partial wafer has a reference die then go to step 104, otherwise go to Step 105. The FIG. 5 shows the partial wafer with the reference die. FIG. 6 shows a partial wafer without a reference die.

Step 104. The wafer table is positioned to reference die, and then goes to Step 111.

Step 105. If the partial wafer does not have a reference die get last column (LCOLUMN) information from wafer map data header field labeled "Previous Partial Wafer End Column."

Figure 15:
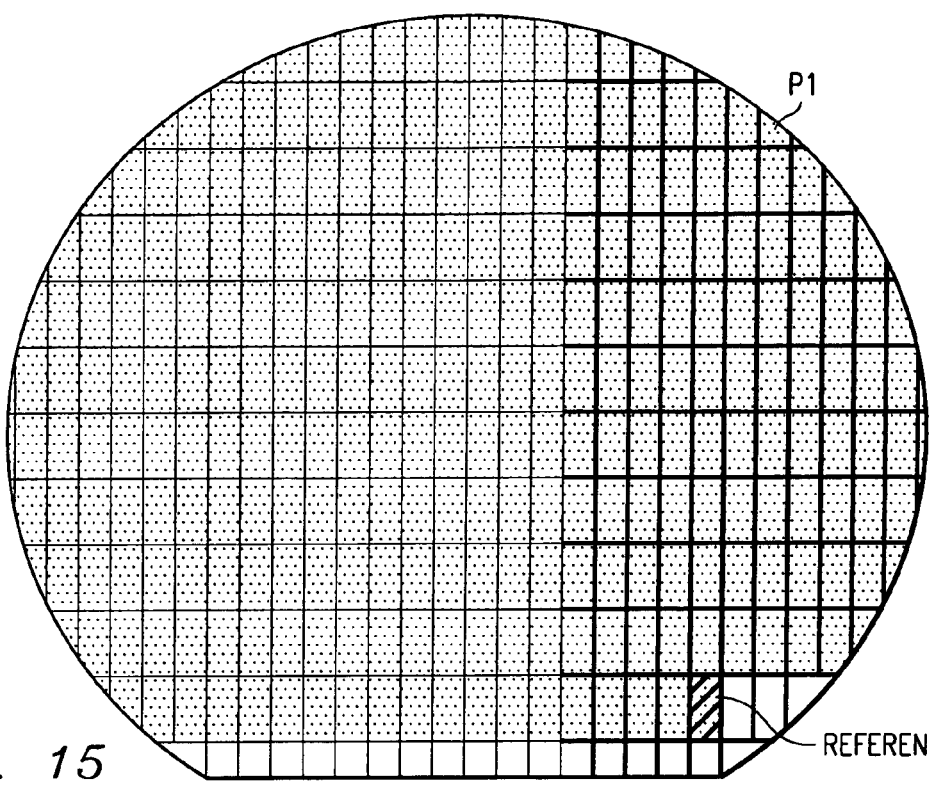
FIG. 15 illustrates removal of dies from map that are not part of the partial wafer P1.
Figure 16:
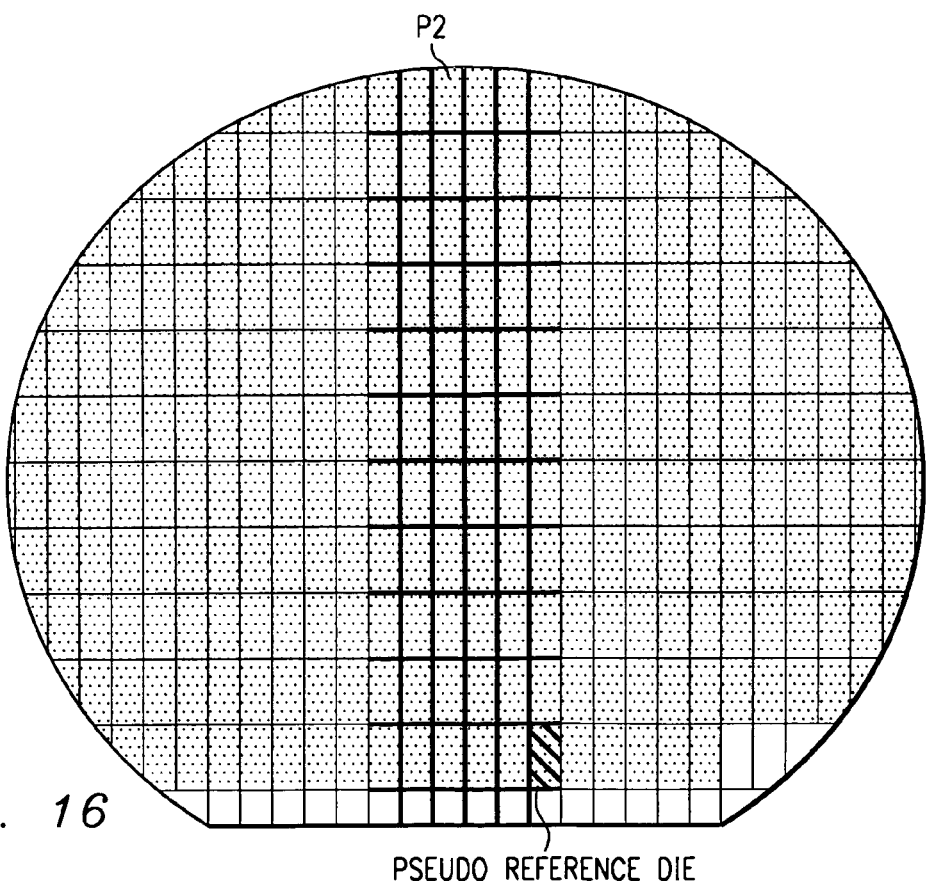
FIG. 16 illustrates removal of dies from map that are not part of partial wafer P2.

Step 106. Using LCOLUMN information remove all dies in the right side of partial wafer. Remove all dies in the map that has the X coordinates less than or equal to LCOLUMN. The FIGS. 15 and 16 show removal of dies from the map.

Step 107. Move the wafer table to pseudo reference die which is the first die in the bottom right. The FIGS. 10 and 11 show the Pseudo Reference die of a partial wafer.

Figure 18:
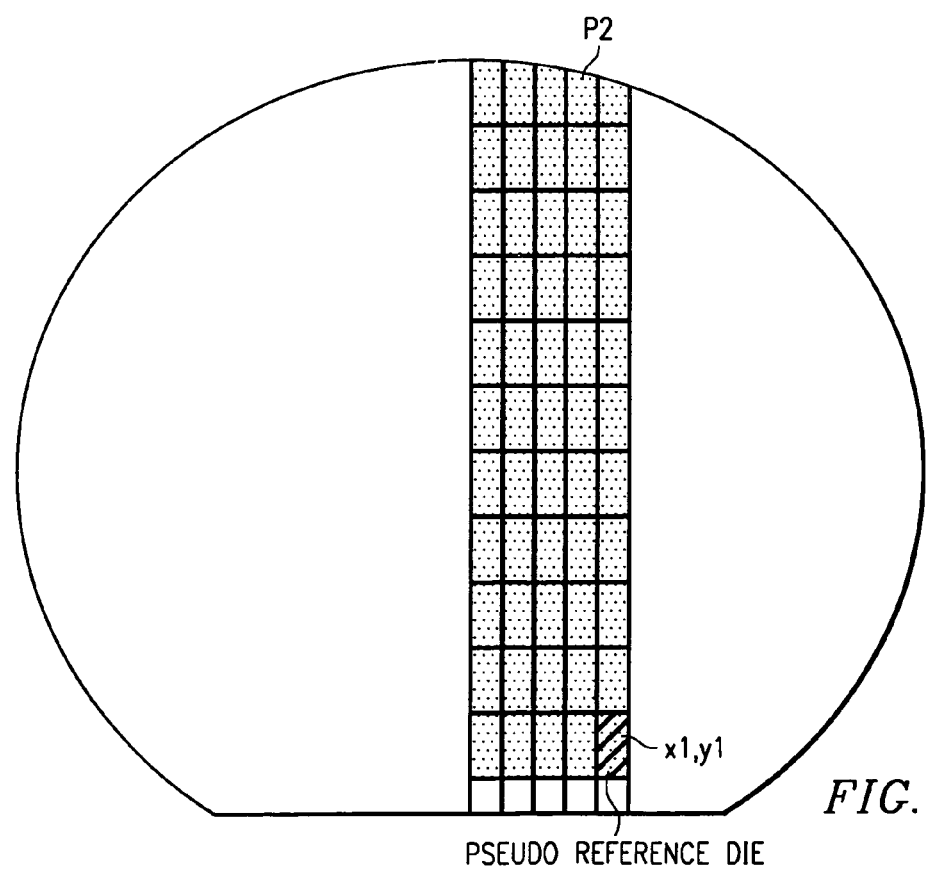
FIG. 18 illustrates computation of pseudo reference die coordinates.

Step 108. Computes the pseudo reference die coordinates as follows: pseudo reference die coordinate (x1, y1) is: x1=first column from right to left that has a die in the wafer map data and y1=first bottom most row in the column x1 from the wafer map data. See FIG. 18.

Step 109. If this partial wafer is not the last partial wafer of this wafer then go to Step 111. The FIG. 12 shows the last partial wafer with pseudo reference die.

Step 110. Set the LCOLUMN as complete if this is the last partial wafer and then go to Step 113.

Figure 19:
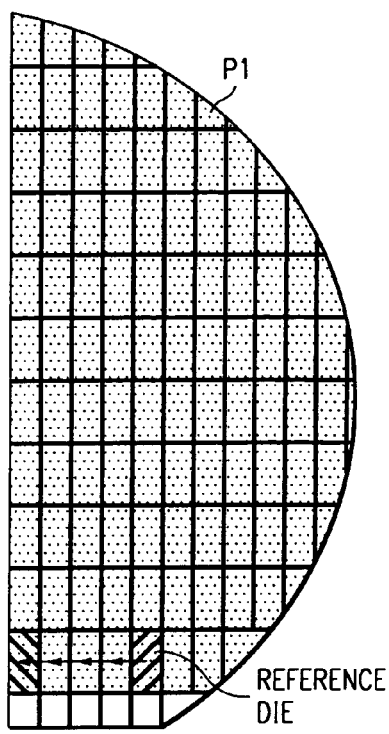
FIG. 19 illustrates moving the wafer table from reference die to last column (manual method).
Figure 20:
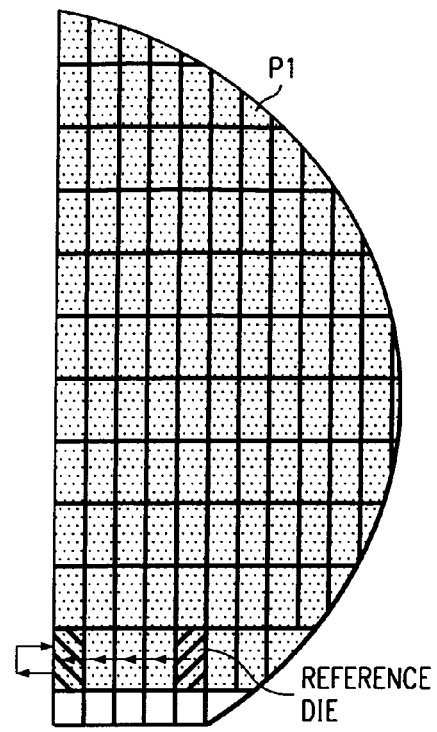
FIG. 20 illustrates moving wafer table from reference die to last column (automated method).
Figure 21:
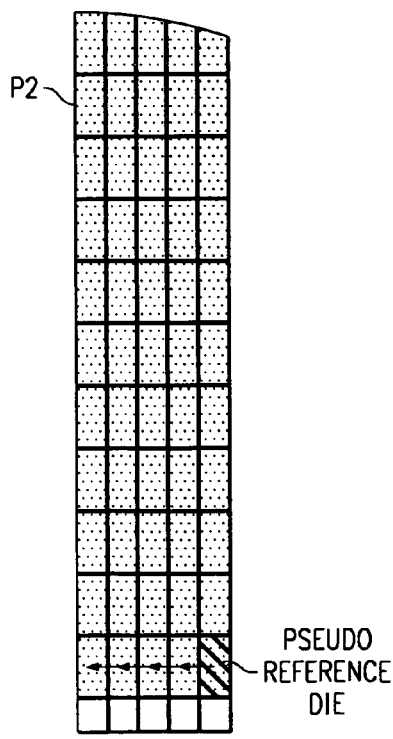
FIG. 21 illustrates moving wafer table from pseudo reference die to last column (manual method).
Figure 22:
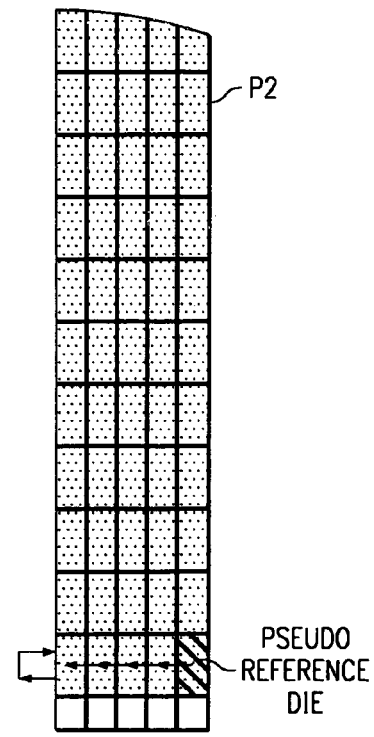
FIG. 22 illustrates moving wafer table from pseudo reference die to last column(automated method).

Step 111. Move the wafer table to the last left column (LCOLUMN) of the partial wafer. It can be done by manually or automatically. In the manual method move the wafer table one die at a time to the left until the last die in the same row. In automatic method the wafer table moves one die at a time to the left until it sees a no die position. The FIG. 19 shows the manual wafer table movement from reference die to last column. FIG. 20 shows the automatic wafer table movement from reference die to last column. FIG. 21 shows the manual wafer table movement from pseudo reference die to last column. FIG. 22 shows the automatic wafer table movement from the pseudo reference die to last column.

Figure 17:
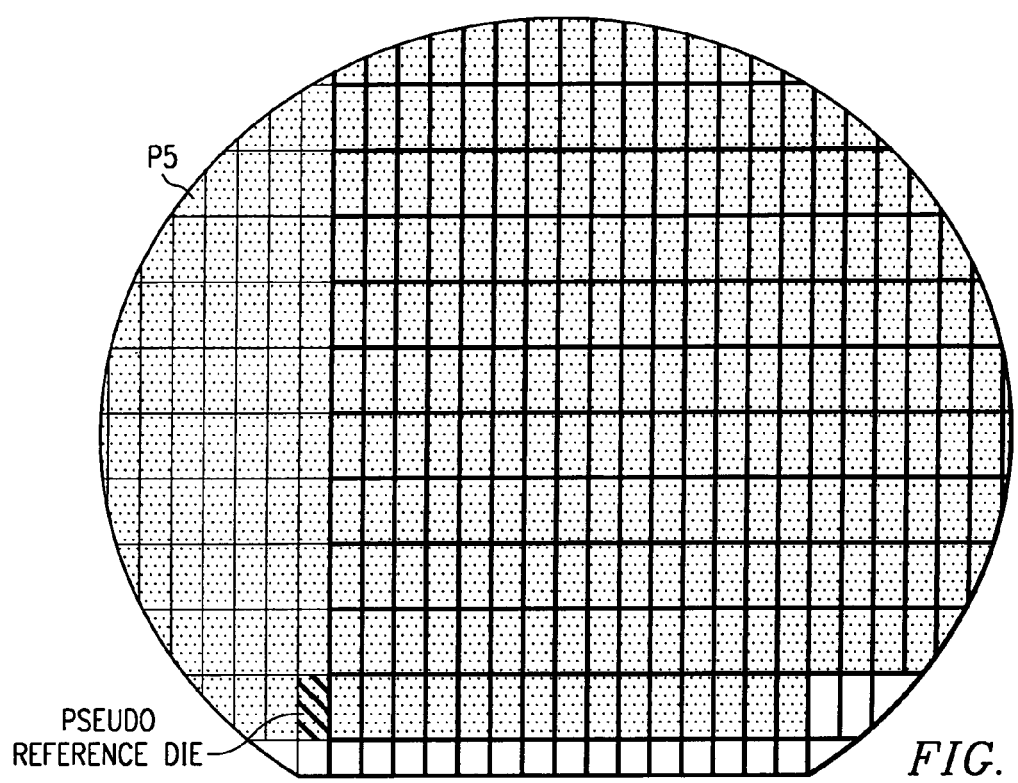
FIG. 17 illustrates removal of dies from map that are not part of partial wafer P5.

Step 112. Using LCOLUMN information remove all dies from the wafer map data that are not part of this partial wafer. Remove all dies in the map that has the X (column) coordinate greater than LCOLUMN. FIGS. 15,16 and 17 show the removal of dies from the map.

Step 113. Update the LCOLUMN in the wafer map data header field "Previous Partial Wafer End Column" in the original wafer map.

Step 114. Save the wafer map data file for next partial wafer of the same wafer to process. Wafer map data file can be saved in the pick and place equipment or send the data to wafer map data host or other storage systems.

Step 115. Start Pick & Place operation.

Method 2

Figure 23:
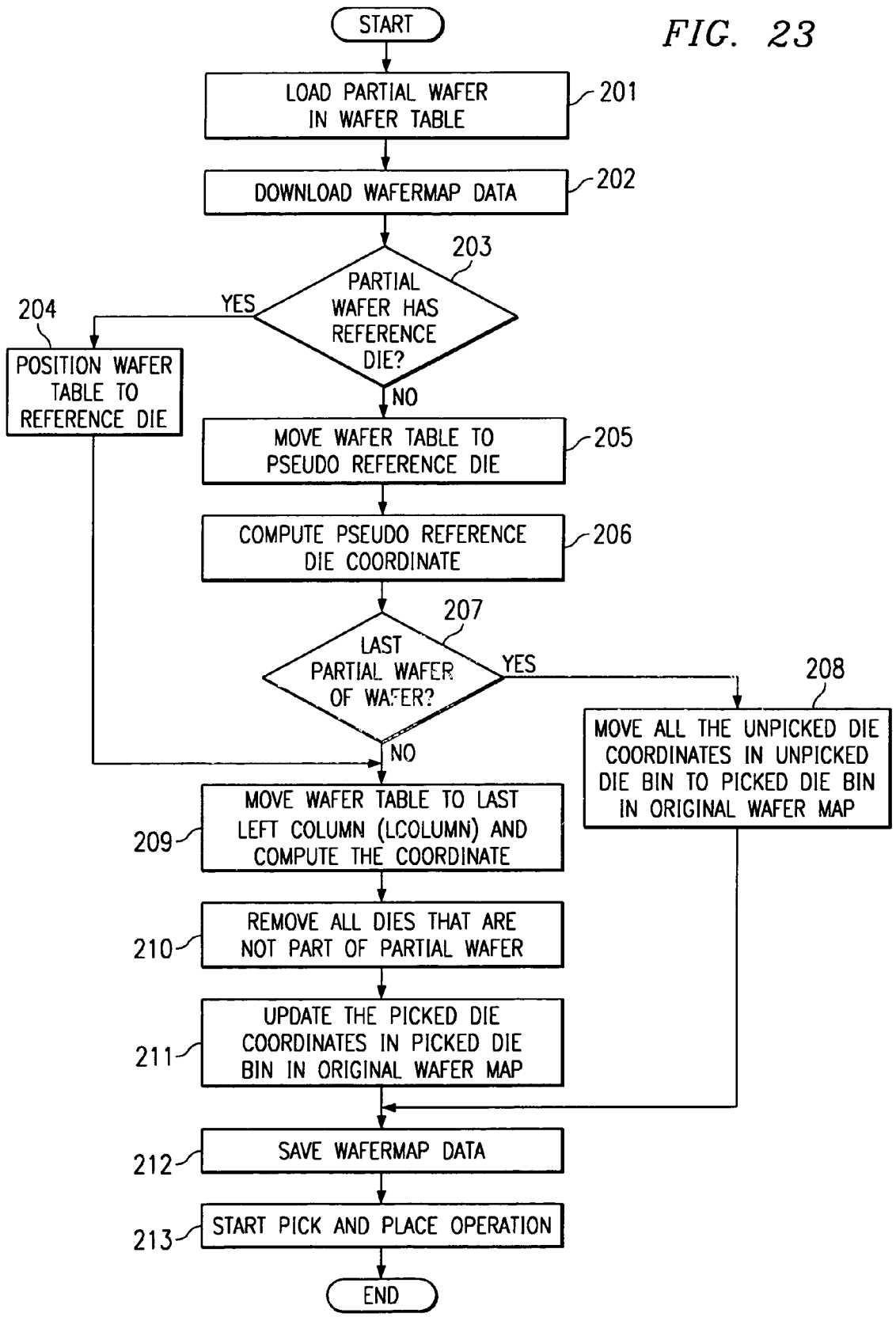
FIG. 23 illustrates the method of processing the wafers at the pick and place wafer fab location according to a second embodiment of the present invention.

FIG. 23 illustrates the flow chart according to a second embodiment of the present invention. The following steps are based on the zero degree of wafer rotation angle. The same steps are applicable for different rotation angles. The assumption in the method is one Bin number (for example 200) is assigned to a category as die picked and this Bin number is called Picked Die Bin. All other Bins are called Unpicked Die Bins.

Step 201. Load partial wafer into wafer table of Pick & Place equipment after saw.

Step 202 Download wafer map data for the wafer from wafer map data host.

Step 203. If the partial wafer has a reference die then go to Step 204, otherwise go to Step 205. The FIG. 5 shows the partial wafer with the reference die. FIG. 6 shows a partial wafer without a reference die.

Step 204. Position wafer table to reference die then go to Step 209.

Step 205. Move the wafer table to the pseudo reference die which is the first die in the bottom right. FIGS. 10 and 11 shows the pseudo reference die of a partial wafer.

Step 206. Compute the pseudo reference die coordinate as follows: pseudo reference die coordinate (x1, y1) is x1=first column from right to left that has a die in unpicked die bin of wafer map data and y1=first bottom most row in the column x1 in unpicked die bin of wafer map data. See FIG. 17.

Step 207. If this partial wafer is the last partial wafer for this wafer then go to Step 208. FIG. 16 shows the last partial wafer with Pseudo Reference die. If this partial wafer is not the last partial wafer then go to Step 209.

Step 208. In the original wafer map, move all the unpicked the coordinates in the unpicked die bin to picked die bin.

Step 209. Move the wafer table to the last left column (LCOLUMN) of the partial wafer. It can be done by manually or automatically. In manual method move the wafer table one die at a time to left until the last die in the same row. In automatic method the wafer table moves one die at a time to left until it sees a no die position. FIG. 19 shows the manual wafer table movement from reference die to last column. FIG. 20 shows the automatic wafer table movement from reference die to last column (LCOLUMN). FIG. 21 shows the manual wafer table movement from pseudo reference die to last column LCOLUMN). The FIG. 22 shows the automatic wafer table movement from pseudo reference die to last column (LCOLUMN).

Step 210. Using LCOLUMN information remove all dies from the wafer map data that are not part of this partial wafer. Remove all dies in the map that has the X (column) coordinate greater than LCOLUMN. FIGS. 15, 16 and 17 show removal of dies from the map.

Step 211. In the original wafer map, update the picked die coordinates in the picked die bin and remove the picked die coordinates from the unpicked die bin.

Step 212. Save the wafer map data file for next partial wafer of the same wafer to process. Wafer map data file can be saved in the pick and place equipment or send the data to wafer map data host or other storage systems.

Step 213. Start pick and place operation.

Method 3

Figure 14:
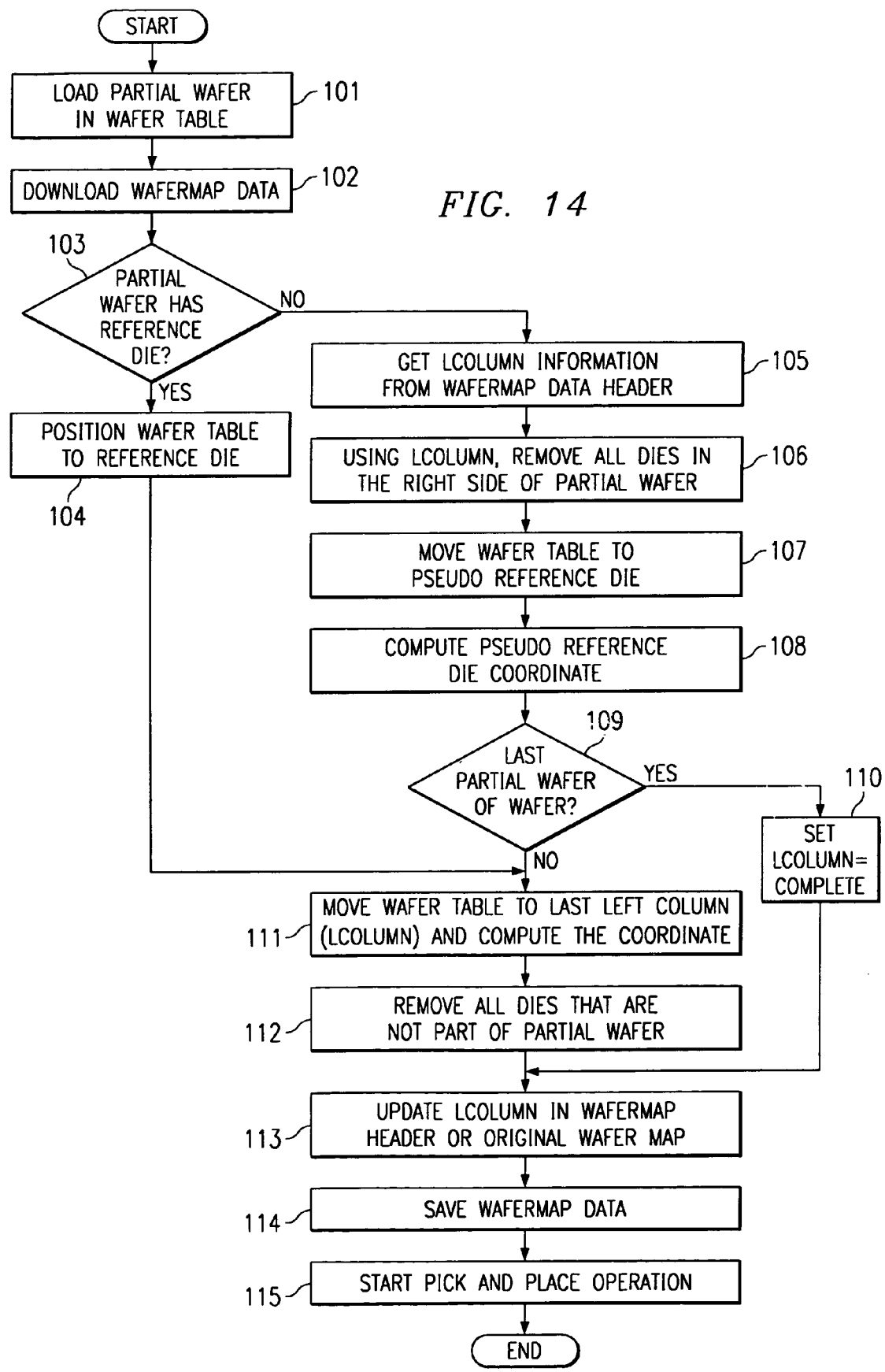
FIG. 14 illustrates the method of processing the wafers at the pick and place wafer fab location according to one embodiment of the present invention.
Figure 24:
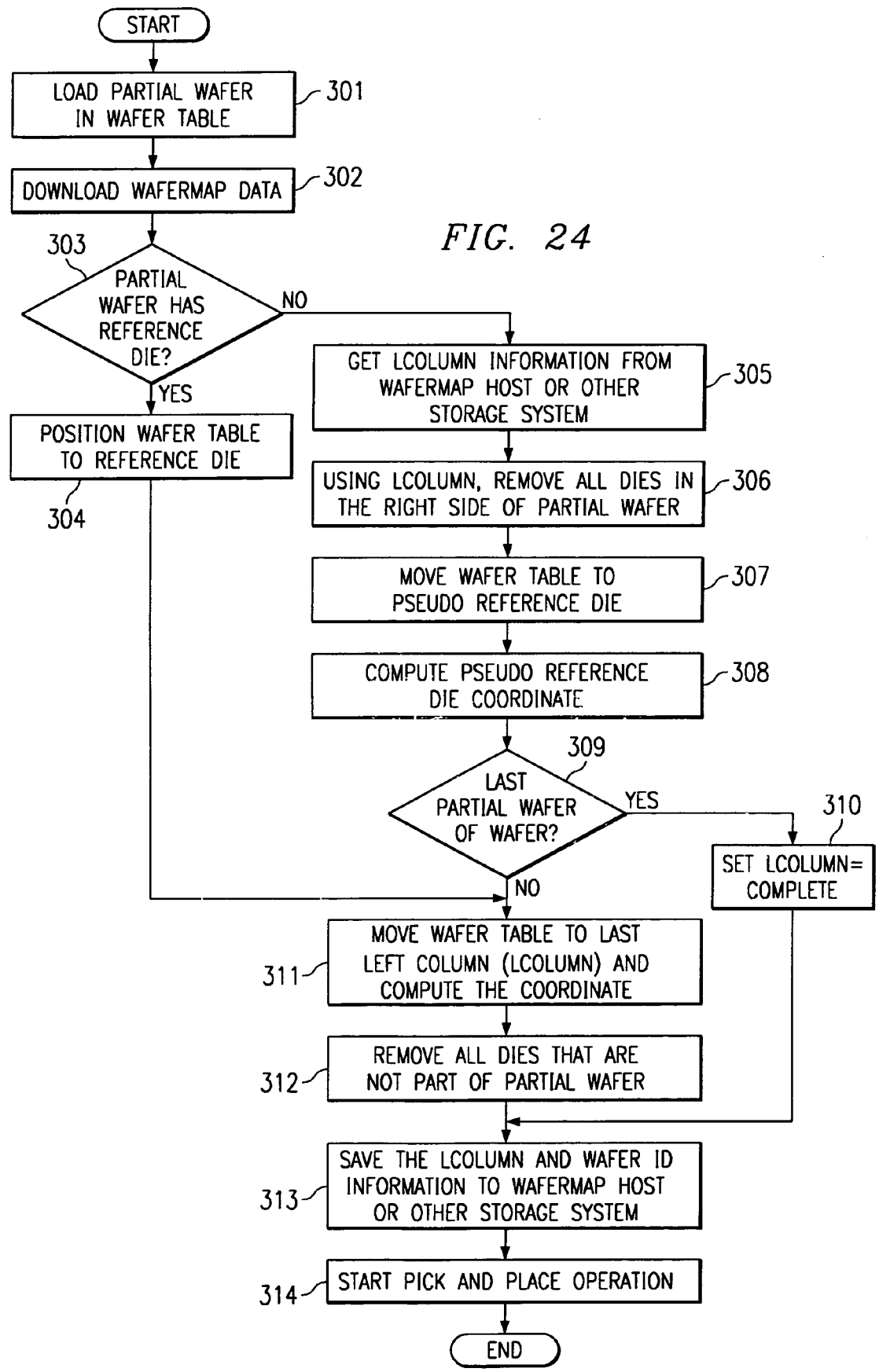
FIG. 24 illustrates the method of processing the wafers at the pick and place wafer fab location according to a third embodiment of the present invention.

The following method according to another embodiment of the present invention is illustrated in FIG. 24 steps and is based on the zero degree of wafer rotation angle. The same steps are applicable for different rotation angles. Difference between this method and first method (Method 1) in FIG. 14 is just storing LCOLUMN and wafer identification information in some other storage location other than not storing in the map data itself. The LCOLUMN information represents the last column of the previous partial wafer.

Step 301. Load partial wafer into wafer table of pick and place equipment after saw.

Step 302. Download wafer map data for the wafer from wafer map data host.

Step 303. If the partial wafer has reference die then go to Step 304 otherwise go to Step 305. FIG. 5 shows the partial wafer with reference die. FIG. 6 shows a partial wafer without reference die.

Step 304. Position wafer table to reference die then go to Step 311.

Step 305. Get LCOLUMN information from pick and place equipment or wafer map data host or other storage systems (not from wafer map data header).

Step 306. Using LCOLUMN information remove all dies in the right side of partial wafer. Remove all dies in the map that has the X coordinate less than or equal to LCOLUMN. FIGS. 16 and 17 show removal of dies from the map.

Step 307. Move the wafer table to pseudo reference die which is the first die in the bottom right. FIGS. 10 and 11 show the Pseudo Reference die of a partial wafer.

Step 308. Compute Pseudo Reference die coordinate as follows:

Pseudo Reference die coordinate (x1,y1) is x1=First column from right to left that has a die in the wafermap data.

y1=First bottom most row in the column x1 from the wafermap data. See FIG. 17.

Step 309. If this partial wafer is not he last partial wafer for this wafer then go to Step 311. FIG. 12 shows the last partial wafer with Pseudo Reference die.

Step 310. Set the LCOLUMN as COMPLETE. Go to step 313.

Step 311. Move the wafer table to the last left column (LCOLUMN) of the partial wafer. It can be done by manually or automatically. In manual method move the wafer table one die at a time to left until the last die in the same row. In automatic method the wafer table moves one die at a time to left until it sees a no die position. FIG. 19 shows the manual wafer table movement from Reference die to Last column. The FIG. 19 sows the automatic wafer table movement from Reference die to Last column. The FIG. 21 shows the manual wafer table movement from Pseudo Reference die to Last column. FIG. 22 shows the automatic wafer table movement from Pseudo Reference die to last column (LCOLUMN).

Step 312. Using LCOLUMN information remove all dies from the wafer map data that are not part of this partial wafer. Remove all dies in the map that has the X (column) coordinate greater than LCOLUMN. FIGS. 15, 16 and 17 show removal of dies from the map.

Step 313. Save the LCOLUMN and wafer identification information for next partial wafer of the same wafer to process. This data can be saved in the pick and place equipment or send the data to wafer map data host or other storage systems.

Step 314. Start pick and place operation.

Method 4

Figure 25:
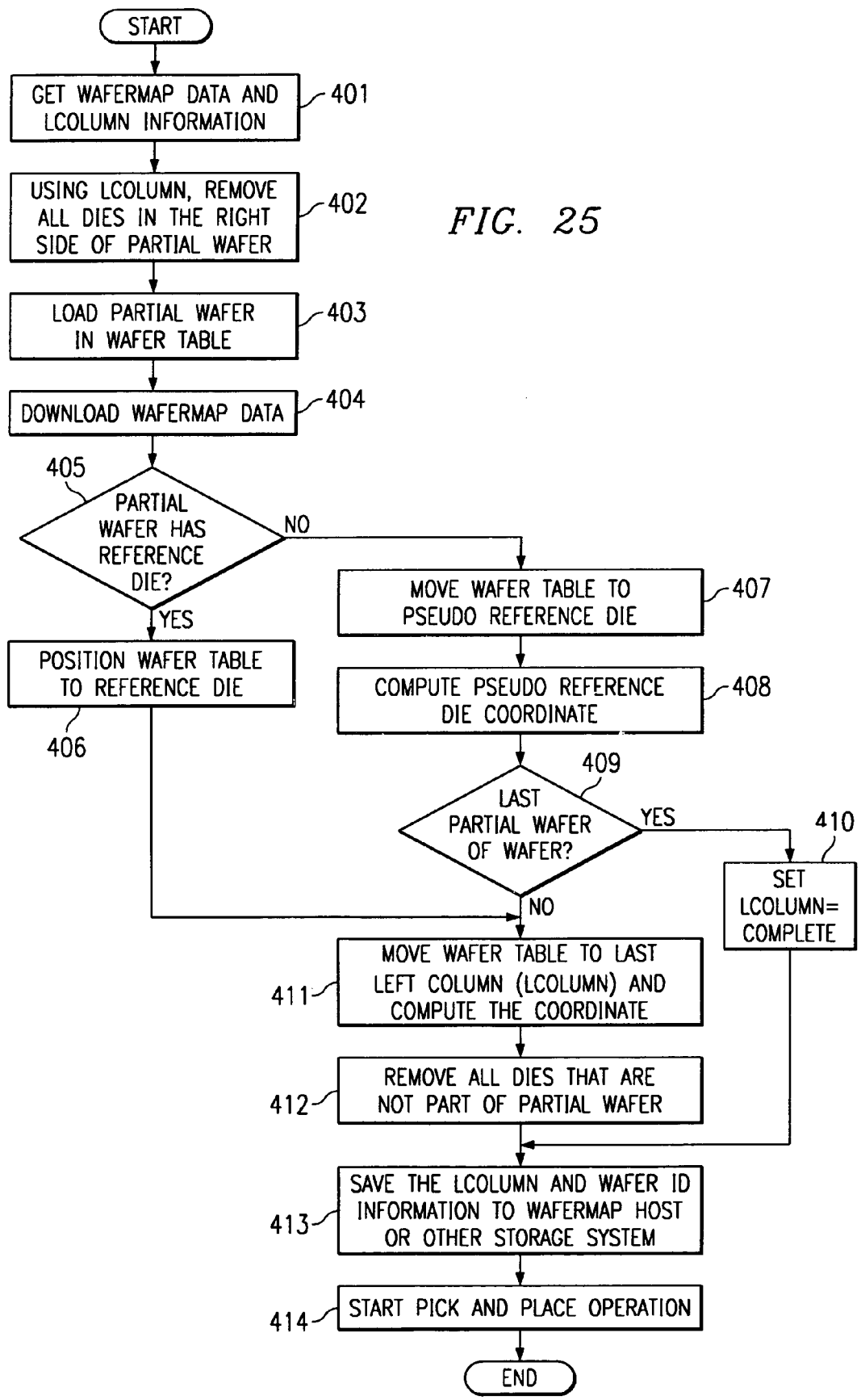
FIG. 25 illustrates the method of processing the wafers at the pick and place wafer fab location according to a fourth embodiment of the present invention.

Referring to FIG. 25 there is illustrated the method 4 according to another embodiment of the present invention. The following steps are based on the zero degree of wafer rotation angle. The same steps are applicable for different rotation angles. Difference between this method and other methods is that preprocessing is done on the partial wafer so that only partial wafer map data will be sent to the mounter.

Preprocessing (Step 1 & 2)

Step 401. Get the wafer map data and last column (LCOLUMN) information (if available from the previous process, LCOLUMN information is not available for the first partial wafer).

Step 402. Convert the wafer map data as follows:

Case 1. From the last column (LCOLUMN) information update the wafer map of picked die bin die coordinates as follows. Move all dies from the unpicked die bin which has the X (column) coordinate less than or equal to last column (LCOLUMN) into picked die bin.

Case 2. Using last column (LCOLUMN) information eliminates other partial wafer dies from the map. Remove all dies in the map, which has the X (column) coordinate less than or equal to last column (LCOLUMN).

Save the wafer map data for processing.

Step 403. Load partial wafer into wafer table of Pick & Place equipment after saw.

Step 404. Get the preprocessed wafer map data from Step 402.

Step 405. If the partial wafer has reference die then go to Step 406 otherwise go to Step 407. FIG. 5 shows the partial wafer with a reference die. FIG. 6 shows a partial wafer without a reference die.

Step 406. Position wafer table to reference die and go to Step 411.

Step 407. Move the wafer table to pseudo reference die which is the first die in the bottom right. FIGS. 10 and 11 show the pseudo reference die of a partial wafer.

Step 408. Compute pseudo reference die coordinate as follows:
Pseudo reference die coordinate (x1,y1) is
x1=First column from right to left that has a die in the wafer map data.
y1=First bottom most row in the column x1 from the wafer map data. See FIG. 17.
Step 409. If this partial wafer is not the last partial wafer for this wafer then go to Step 411. FIG. 12 shows the last partial wafer with pseudo reference die.
Step 410. Set the LCOLUMN as COMPLETE and go to Step 413.
Step 411. Move the wafer table to the last left column (LCOLUMN) of the partial wafer. It can be done by manually or automatically. In manual method move the wafer table one die at a time to left until the last die in the same row. In automatic method the wafer table moves one die at a time to left until it sees a no die position. FIG. 19 shows the manual wafer table movement from reference die to last column (LCOLUMN). FIG. 20 shows the automatic wafer table movement from reference die to LCOLUMN. FIG. 21 shows the manual wafer table movement from pseudo reference die to last column (LCOLUMN). FIG. 22 shows the automatic wafer table movement from pseudo reference die to last column (LCOLUMN).
Step 412. Using LCOLUMN information remove all dies from the wafer map data that are not part of this partial wafer. Remove all dies in the map that has the X (column) coordinate greater than LCOLUMN. FIGS. 15, 16 and 17 show removal of dies from the map.
Step 413. Save the LCOLUMN and wafer identification information for next partial wafer of the same wafer to process. This data can be saved in the pick and place equipment or send the data to wafer map data host or other storage systems.
Step 414. Start Pick & Place operation.
FIG. 26 summarizes the old method in application Ser. No. 09/262,265; filed Mar. 4, 1999 and entitled "Partial Semiconductor Wafer Processing with Multiple Cuts of Random Sizes" with the four new methods presented herein.

Although the present invention and its advantages have been described in detail, it should be understood that various changes, substitution and alterations can be made without departing from the spirit and scope of the invention as defined by the appended claims.

The invention claimed is:

1. A method of processing a partial wafers that does not have a reference die comprising the steps of:
    making all partial wafer cuts perpendicular to the wafer flat with all partial wafer cuts following a cut sequence where the first cut section is with a reference die and the other cut sections are in the numerical order from right to left with the first partial wafer of the full wafer having the reference die;
    providing wafer map data and last left column coordinate (LCOLUMN) of a previous partial wafer to the partial wafer to be processed to pick and place equipment;
    using said last left column coordinate (LCOLUMN) removing all dies from wafer map data that have a column coordinate number equal to and less than said LCOLUMN and therefore are not part of this partial wafer;
    identifying a pseudo reference die for each partial wafer not having a reference die which die is the first die in the bottom right after removing all dies in the right side of the partial wafer using said last left column (LCOLUMN) information and where the partial wafer does not have to contain at least one full die in the reference die row and the wafer table does not have to be moved to verify the pseudo reference die and does not require uploading of die coordinates to host from a processing using the reference die;
    moving wafer table to the last left column of the partial wafer and determining the coordinate;
    storing the coordinate of the last left column in a wafer map data file;
    removing all dies from the wafer map that are to the left of the last left column of the partial wafer and not part of the partial wafer using said coordinate; and
    performing picking and placing dies.

2. The method of claim 1 wherein said last column number is placed in the header of the a wafer map data file for the next partial wafer.

3. The method of claim 2 wherein the last column information is stored in the wafer map data file and the same wafer map data file is used for all partial wafers with different last column values.

4. The method of claim 1 including the step of assigning a new bin number to picked die and the picked die coordinates are stored and the last column information is used to find the edge and the picked die coordinates are stored in a wafer map data file and the same wafer map data file is used for all partial wafers and after a partial process is completed all the picked die coordinates are moved to the picked die bin.

5. The method of claim 4 wherein said pseudo reference die is determined by the die coordinate (x1,y1) where x1=first column from right to left that has a die in the wafermap data and y1=first bottom most row in the column x1 from the wafermap data or x1=first column from right to left that has a die in unpicked die bin of wafer map data and y1=first bottom most row in the column x1 in unpicked die bin of the wafer map data.

6. The method of claim 1 wherein the last column and wafer identification is stored in a separate file not associated with a wafer map data file and wherein before processing a partial wafer getting the last column information from the storage.

7. The method of claim 1 wherein there is preprocessing on the partial wafer so that only partial wafer map data is available prior to said step of performing picking and placing, rather than information relating to the coordinate of said last left column.

8. A method of processing a partial wafers that does not have a reference die comprising the steps of: making all partial wafer cuts perpendicular to the wafer flat with all partial wafer cuts following a cut sequence where the first cut section is with a reference die and the other cut sections are in the numerical order from right to left with the first partial wafer of the full wafer having the reference die;
    providing a wafer map data file containing a header identifying a partial wafer and identifying a starting column for processing the partial wafer based on the last left column of the previous partial wafer where the partial wafer does not have to contain at least one full die in the reference die row and and operating a wafer pick and place equipment to begin at the starting column location of the partial wafer identified by the header for wafer mapping operations to process the partial wafer for picking good dies.

9. A method of processing a partial wafer in pick and place equipment wherein all partial wafer cuts are made perpendicular to the wafer flat with all partial wafer cuts following a cut sequence where the first cut section is with a reference die and the other cut sections are in the numerical order from right to left with the first partial wafer of the full wafer having a reference die;

comprising the steps of:

loading partial wafer into wafer table of pick and place equipment after saw;

downloading wafer map data for the wafer from wafer map data host containing a header field for a partial wafer without a reference die with a last column (LCOLUMN) number in the first row of the previous partial;

if the partial wafer has a reference die positioning the wafer table to the reference die and moving the wafer table to the last column of the partial wafer and removing all die not part of the partial wafer;

if the partial wafer does not have a reference dies getting said last column (LCOLUMN) number information from the wafer map data header field and using said last column LCOLUMN) number information removing all dies in the right side of the partial wafer;

moving the wafer table to pseudo reference die which is the first die in the bottom right after removing all dies in the right side of the partial wafer using said last left column (LCOLUMN) information and the partial wafer does not have to contain at least one full die in the reference die row;, computing the pseudo reference die coordinate (x1 ,y1) where x1=first column from right to left that has a die in the wafer map data and y1=first bottom most row in the column x1 from the wafer map data;

if this partial wafer is not the last partial wafer of this wafer moving the wafer table to the last left column (LCOLUMN) of the partial wafer and using the last left column (LCOLUMN) information removing all dies that are not part of this partial wafer;

setting the last left column (LCOLUMN) as complete if this is the last partial wafer;

updating the last left column (LCOLUMN) in the wafer map data header field;

saving the wafer map data file with updated last left column (LCOLUMN) header field for next partial wafer of the same wafer to process in the pick and place equipment or send the data to wafer map data host or other storage systems; and perform pick and place.

10. A method of processing a partial wafer in pick and place equipment wherein all partial wafer cuts are made perpendicular to the wafer flat with all partial wafer cuts following a cut sequence where the first cut section is with a reference die and the other cut sections are in the numerical order from right to left with the first partial wafer of the full wafer having a reference die; comprising the steps of:

loading partial wafer into wafer table of pick and place equipment after saw;

downloading wafer map data for the wafer from wafer map data host with different bin number for picked die bin for picked dies to distinguish from unpicked dies in unpicked die bins;

if the partial wafer has a reference die positioning wafer table to reference die and moving the wafer table to the last left column (LCOLUMN) of the partial and removing all dies to the left of the partial wafer that are not a part of the partial wafer and update the picked die coordinates in picked die bin in original wafermap and save the wafermap data, if the partial wafer does not have a reference die moving the wafer table to the pseudo reference die which is the first unpicked die in the bottom right and the partial wafer does not have to contain at least one full die in the reference die row; computing the pseudo reference die coordinate (x1, y1) where x1=first column from right to left that has a die in unpicked die bin of wafer map data and y1=first bottom most row in the column x1 in unpicked die bin of wafer map data;

if this partial wafer is the last partial wafer for this wafer then in the original wafer map, moving all the unpicked the die coordinates in an unpicked die bin to picked die bin;

if this partial wafer is not the last partial wafer moving the wafer table to the last left column (LCOLUMN) of the partial wafer and determine the coordinate;

using last left column (LCOLUMN) coordinate information removing all dies from the wafer map data that are not part of this partial wafer;

in the original wafer map, updating the picked die coordinates in the picked die bin;

saving the wafer map data file for next partial wafer of the same wafer to process and performing pick and place operation.

11. A method of processing a partial wafer in pick and place equipment where all partial wafer cuts are made perpendicular to the wafer flat with all partial wafer cuts following a cut sequence where the first cut section is with a reference die and the other cut sections are in the numerical order from right to left with the first partial wafer of the full wafer having a reference die comprising the steps of:

loading partial wafer into wafer table of pick and place equipment after saw;

downloading wafer map data for the wafer from storage;

if the partial wafer has reference die positioning wafer table to reference die, moving the wafer table to the last left column (LCOLUMN) of the partial wafer containing the reference die, determine coordinate and remove all dies that are not part of the partial wafer and storing the last left column (LCOLUMN) coordinate in storage for the next partial wafer;

if the partial wafer does not have a reference die getting LCOLUMN coordinate information for the previous partial wafer from said storage;

using LCOLUMN coordinate information for the previous partial wafer removing all dies equal to and to the right of said LCOLUMN coordinate information in the right side of partial wafer;

moving the wafer table to pseudo reference die which is the first die in the bottom right after removing all dies in the right side of the partial wafer using said last left column (LCOLUMN) information and the partial wafer does not have to contain at least one full die in the reference die row; computing pseudo reference die coordinate (x1, y1) where x1=first column from right to left that has a die in the wafermap data and y1=first bottom most row in the column x1 from the wafermap data and the partial wafer does not have to contain at least one full die in the reference die row;

if this partial wafer is not the last partial wafer for this wafer moving the wafer table to the last left column (LCOLUMN) of the partial wafer and determining the coordinate and using the coordinate removing all dies from the wafer map that are not part of the partial wafer;

saving in storage the (LCOLUMN) and wafer identification information for next partial wafer of the same wafer to process; and processing pick and place operation.

12. A method of processing a partial wafer in pick and place equipment comprising the steps of:

loading partial wafer into wafer table of pick and place equipment after saw;

downloading wafer map data for the wafer from wafer map data host and the last column information of the previous partial wafer; said wafer map data being preprocessed by getting wafer map data and last column information;

removing all dies from the wafer map in the right side of the partial wafer using last column information and saving the wafer map data for processing;

if the partial wafer has reference die positioning wafer table to reference die, moving the wafer table to the last left column (LCOLUMN) of the partial wafer, determine coordinate and remove all dies that are not part of the partial wafer;

if the partial wafer does not have a reference die moving the wafer table to the pseudo reference die which is the first die in the bottom right after removing all dies in the right side of the partial wafer using said last left column (LCOLUMN) information and the partial wafer does not have to contain at least one full die in the reference die row; computing the pseudo reference die coordinate;

if this partial wafer is the last partial wafer for this wafer then in the original wafer map, moving all the unpicked the die coordinates in an unpicked die bin to picked die bin;

if this partial wafer is not the last partial wafer moving the wafer table to the left column of the partial wafer and determine the coordinate;

using LCOLUMN information removing all dies from the wafer map data that are not part of this partial wafer;

in the original wafer map, updating the picked die coordinates in the picked die bin;

saving the wafer map data file for next partial wafer of the same wafer to process and performing pick and place operation.

13. The method of claim 12 wherein said first removing step includes converting the wafer map data by moving all dies from unpicked die bin which has column coordinates less than or equal to the last column into picked die bin.

14. The method of claim 12 wherein said first removing step includes removing all dies in the map which has the column coordinates less than or equal to the last column.

* * * * *